(12) United States Patent
Klein et al.

(10) Patent No.: US 7,348,826 B1
(45) Date of Patent: Mar. 25, 2008

(54) COMPOSITE FIELD EFFECT TRANSISTOR

(75) Inventors: Jonathan Klein, Palo Alto, CA (US); Morris Tsou, San Jose, CA (US)

(73) Assignee: QSpeed Semiconductor Inc., Santa Clara, CA (US)

( * ) Notice: Subject to any disclaimer, the term of this patent is extended or adjusted under 35 U.S.C. 154(b) by 43 days.

(21) Appl. No.: 11/378,412

(22) Filed: Mar. 16, 2006

Related U.S. Application Data

(60) Provisional application No. 60/663,315, filed on Mar. 18, 2005.

(51) Int. Cl.
*H03K 17/687* (2006.01)
(52) U.S. Cl. ...................... 327/430; 327/421
(58) Field of Classification Search ............... 327/421, 327/430
See application file for complete search history.

(56) References Cited

U.S. PATENT DOCUMENTS

| | | | | |
|---|---|---|---|---|
| 4,323,799 A | * | 4/1982 | King et al. | 327/394 |
| 4,492,883 A | * | 1/1985 | Janutka | 327/377 |
| 4,853,563 A | * | 8/1989 | Hill et al. | 326/83 |
| 5,514,996 A | * | 5/1996 | Aizawa | 327/514 |

* cited by examiner

*Primary Examiner*—Kenneth B. Wells
(74) *Attorney, Agent, or Firm*—Morgan, Lewis & Bockius LLP

(57) ABSTRACT

A composite field effect transistor, in accordance with one embodiment, includes a zener diode, a junction field effect transistor and a metal-oxide-semiconductor field effect transistor. A gate of the junction field effect transistor is coupled to an anode of the zener diode. A cathode of the zener diode is coupled to a gate of the metal-oxide-semiconductor field effect transistor. A drain of the metal-oxide-semiconductor field effect transistor is coupled to a source of the junction field effect transistor.

20 Claims, 2 Drawing Sheets

COMPOSITE FIELD EFFECT TRANSISTOR

CROSS-REFERENCE TO RELATED APPLICATIONS

This application claims the benefit of U.S. Provisional Application No. 60/663,315 filed Mar. 18, 2005.

BACKGROUND OF THE INVENTION

Depletion mode junction field effect transistors (JFETs) are efficient semiconductor structures, especially for high-voltage switching applications. However, depletion mode JFETs require a negative gate-to-source potential to turn off. Accordingly, when a system incorporating a JFET is first turned on, the depletion mode JFET is also on, causing undesirable high current to flow in most applications.

An enhancement mode metal-oxide-semiconductor field effect transistor (MOSFET), on the other hand, requires a positive voltage to turn on. Therefore, the MOSFET, being a normally off device, does not typically exhibit high current flows in most applications upon start-up. However, MOSFETs are generally not normally the most cost-efficient devices for high voltage (>100V) applications.

Accordingly, there remains a need for semiconductor device having C) improved high-voltage switching characteristics in combination with low current flow characteristics at start-up and no requirement for negative gate bias.

SUMMARY OF THE INVENTION

Embodiments of the present invention provide a composite field effect transistor that includes a zener diode, a junction field effect transistor and a metal-oxide-semiconductor field effect transistor. A gate of the junction field effect transistor is coupled to an anode of the zener diode. A cathode of the zener diode is coupled to a gate of the metal-oxide-semiconductor field effect transistor. A drain of the metal-oxide-semiconductor field effect transistor is coupled to a source of the junction field effect transistor. In one implementation, the junction field effect transistor is a depletion mode device and the metal-oxide-semiconductor field effect transistor is an n-channel enhancement mode device.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
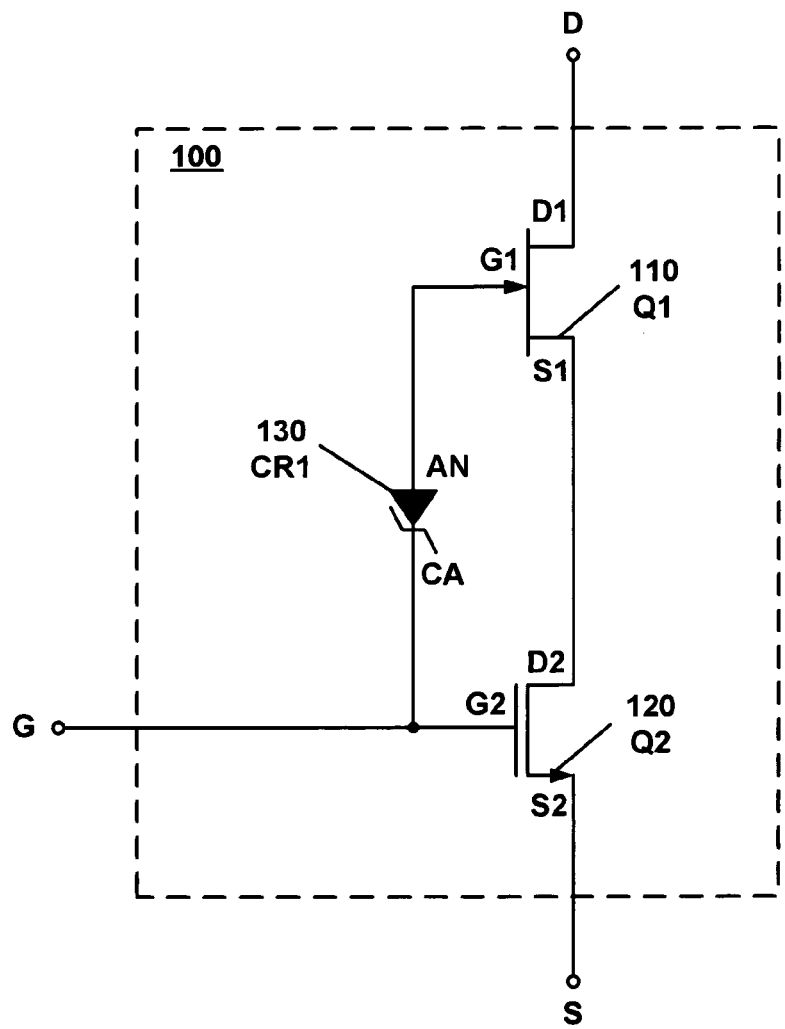
FIG. 1 shows a diagram of a composite field effect transistor (FET), in accordance with one embodiment of the invention.

FIG. 1 shows a diagram of a composite field effect transistor (FET) 100 having a gate, drain and source, in accordance with one embodiment of the invention. The composite FET 100 includes a depletion mode junction field effect transistor (JFET) 110 (Q1), an enhancement mode N-channel metal-oxide-semiconductor field effect transistor (MOSFET) 120 (Q2) and a zener diode 130 (CR1). The drain of the JFET 110 is coupled to the drain of the composite FET 100. The source of the JFET 110 is coupled to the drain of the MOSFET 120. The source of the MOSFET 120 is coupled to the source of the composite FET 100. The anode of the zener diode 130 is coupled to the gate of the JFET 110 and the cathode of the zener diode 130 is coupled to the gate of the MOSFET 120. The gate of the MOSFET 120 is also coupled to the gate of the composite FET 100.

When the gate-to-source potential of the composite FET 100 is less than the threshold voltage ($V_{T(Q2)}$) of the MOSFET 120, the MOSFET 120 is turned off and blocks current from flowing between the source and drain of the composite FET 100. When the gate-to-source potential of the composite FET 100 is greater than the threshold voltage of the MOSFET 120 and less than the breakdown voltage of the zener diode 130, the MOSFET 120 will turn on pulling the source of the JFET 100 down. However, the zener diode 130 blocks the potential at the gate of the JFET 110 and therefore the JFET 110 remains off.

When the gate-to-source potential of the composite FET 100 reaches the threshold voltage of the JFET 110 plus the breakdown voltage of the zener diode 130 ($V_{GS(Q1)}+V_{Z(CR1)}$), both the JFET 110 and MOSFET 120 are turned on and current is conducted between the source and drain of the composite FET 100. In addition, when the gate-to-source potential of the composite FET 100 reaches the threshold voltage of the JFET 110 plus the breakdown voltage of the zener diode 130 ($V_{GS(Q1)}+V_{Z(CR1)}$), current-flowing through the zener diode 120 acts to inject minority carriers into the JFET 110, thereby improving its conductivity of the composite FET 100 especially at high drain currents.

When the gate-to-source potential of the composite FET 100 pulls low, the zener diode 130 conducts in its forward direction and simultaneously pulls the gate potential of the JFET 110 negative while the gate potential of MOSFET 120 is being pulled negative. As a result, the MOSFET 120 begins to turn off. As MOSFET 120 turns off, its drain potential rises, causing the gate-to-source voltage of the JFET 110 to be negative, which in turn causes the JFET 110 to turn off completely, blocking current from flowing between the source and drain of the composite FET 100.

Figure 2:
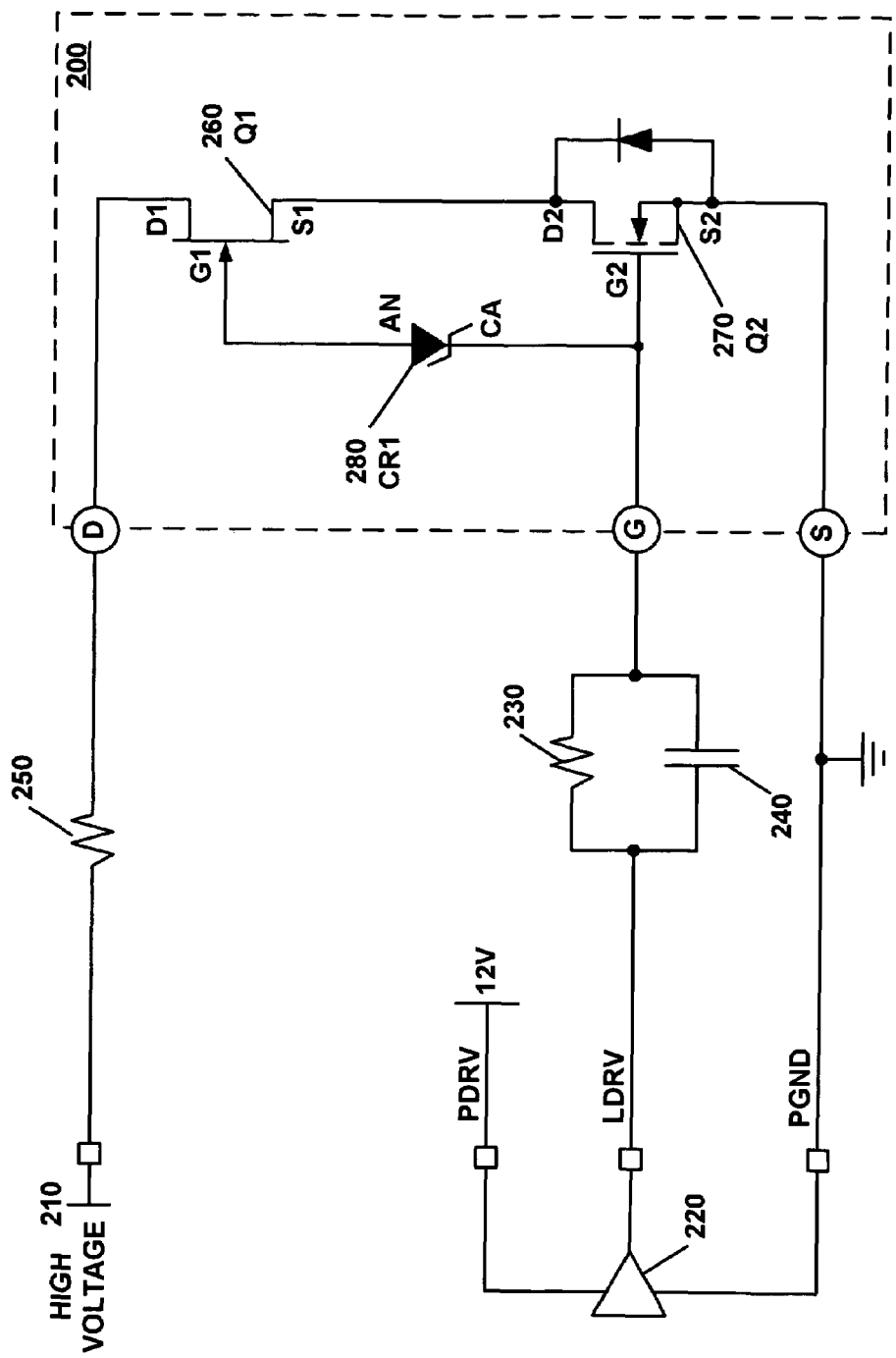
FIG. 2 shows a diagram of a composite FET, in accordance with another embodiment of the invention.

FIG. 2, shows a diagram of a composite FET 200, in accordance with another embodiment of the invention. The composite FET 200 is illustrated coupled to a high voltage source 220 and an external drive circuit 220. The high voltage source 210 is coupled to the drain of the composite FET 200. The external drive circuit 220 is coupled to the gate of the composite FET 200.

A drive impedance 230, 240 is shown coupled between the external drive circuit 220 and the gate of the composite FET 200. The drive impedance 230, 240 may include one or more discrete impedance elements, the output impedance of the external drive circuit, impedance of one or more physical connection and/or the like. In one implementation, the drive impedance 230, 240 coupled between the external drive circuit and the gate of the composite FET 200 may include a resistive 230 and a capacitive 240 element. Furthermore, a load impedance 250 is shown coupled between the high voltage source 210 and the drain of the composite FET 200. The load impedance 250 may be included to limit the current flowing between the source and drain of the switching device so that the device is not damaged due to an over current condition. The load impedance 250 may represent the effective impedance of a circuit that the composite FET 200 is coupled to, and/or include a discrete impedance element, the output impedance of the supply 210, impedance of one or more physical connections and/or the like.

The composite FET 200 includes a depletion mode JFET 260 (Q1), an enhancement mode N-channel MOSFET 270 (Q2) and a zener diode 280 (CR1). The drain of the JFET 260 is coupled to the drain of the composite FET 200. The source of the JFET 260 is coupled to the drain of the MOSFET 270. The source of the MOSFET 270 is coupled to the source of the composite FET 200. The anode of the zener diode 280 is coupled to the gate of the JFET 260 and the cathode of the zener diode 280 is coupled to the gate of the MOSFET 270. The gate of the MOSFET 270 is also coupled to the gate of the composite FET 200.

The composite FET 200 has an "on" and "off" state. In the off state (e.g., initial conditions) the gate-to-source voltage ($V_{GS(Q2)}$) of the MOSFET 270 is substantially 0V. The drain-to-source voltage ($V_{DS(Q2)}$) of the MOSFET 270 may be assumed to be a voltage sufficient to cause the channel of the JFET 260 to pinch off. The JFET may be pinched off when $V_{DS(Q2)} = V_{GS(Q1)PINCHOFF} + 0.7V$, wherein 0.7V is the forward drop of CR1. When the external driver circuit 220 turns on, the drive potential (LDRV) raises, charging the input capacitance ($C_{ISS(Q2)}$) of the MOSFET 270. Once the gate-to-source potential (VGS(Q2)) of the MOSFET 270 has risen above its threshold (e.g., $V_{T(Q2)} = 1.0V$), the channel of the MOSFET 270 will conduct. This will cause the potential at the drain of the MOSFET 270 to pull towards the potential at the source of the MOSFET 200 (e.g., PGND=0V), and will begin to charge the input capacitance ($C_{ISS(Q1)}$) of the JFET 260 through the zener diode 280. The drive potential ($V_{LDVR}$) will then be providing current to charge the input capacitance ($C_{ISS(Q1)}$) of the JFET 260 as soon as there is sufficient potential on the gate of the MOSFET 270 to overcome the breakdown voltage ($V_{Z(CR1)}$) of the zener diode 280.

As the input capacitance ($C_{ISS(Q1)}$) of the JFET 260 charges up, the channel of the JFET 260 begins to turn on. At this point the MOSFET 270 is already fully enhanced, and the input capacitance ($C_{ISS(Q1)}$) of the JFET 260 is being charged by the drive circuit 220 through the capacitive element 270 of the input impedance 230, 240. When the gate-to-source voltage ($V_{GS(Q1)}$) of the JFET 260 reaches the threshold voltage (e.g., $V_{T(Q2)} = 0.7V$) of the JFET 260, the gate-to-source junction will clamp, which will in turn clamp the voltage at the gate of the composite FET 200 to 0.7V+ $V_{Z(CR1)}$. The resistive element 270 of the input impedance 260, 270 will then provide gate current to inject: minority carriers into the JFET 260, thereby improving its conductivity, especially at high drain currents.

In the steady state on state of the composite FET 200, the gate-to-source potential of the MOSFET 270 is at $0.7V+V_{Z(CR1)}$ (e.g., about 5V), and the JFET 260 and MOSFET 270 are both conducting. In addition, the input capacitance 270 is charged to approximately 7V (e.g., $V_{PDRV}-(0.7+V_{Z(CR1)})$).

When the external driver circuit 220 pulls low (e.g., turn-off), the zener diode 280 conducts, discharging the gate of the JFET 260 (e.g., $C_{ISS(Q1)}$) and pulling its voltage towards PGND. The external driver simultaneously discharges the gate of MOSFET 270, causing it to turn off. The input capacitance ($C_{ISS(Q1)}$) of the JFET 260 discharge path is through the channel of the MOSFET 270 initially, then through the body diode of the MOSFET 270, and also flows through zener diode 280, the drive impedance 230, 240, and through driver circuit 220. When the channel of the JFET 260 turns off, the drain of the JFET 260 will rise, forcing additional current back through the drain-to-gate capacitance ($C_{GD(Q1)}$) of the JFET 260 whose discharge current flows through Zener diode 280, capacitance 270 and finally through driver circuit 220 to PGND. When the channel of the MOSFET 270 turns off, the source of the JFET 260 will rise, causing current that is provided by the gate-to-source capacitance ($C_{GS(Q1)}$) of the JFET 260 also to be discharged through the zener diode 280 capacitance 270 and finally through driver circuit 220 to PGND. When the MOSFET 270 drain potential reaches a voltage sufficient to pinch off JFET 260's gate the circuit is fully off with JFET 260 blocking the high voltage and MOSFET 270 blocking sufficient voltage to keep JFET 260 off.

The zener diode 280 causes the n-channel MOSFET 270 to become enhanced before gate current is provided to the depletion mode JFET 260. In addition, the zener diode 280 allows the gate current in the JFET 260 to flow in both directions to rapidly switch the JFET 260. The zener diode 280 also advantageously clamps the potential at the gate of the MOSFET 270, protecting its oxide from potential rupture thus allowing a thin gate oxide to be used. This improves the on resistance ($R_{DS(ON)}$) of the MOSFET 270. The breakdown voltage of the zener diode 280 can also be controlled, allowing the gate drive characteristics of the composite FET 200 to be optimized to the application.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A composite field effect transistor comprising:
   a zener diode;
   a junction field effect transistor having a gate coupled to an anode of the zener diode;
   a metal-oxide-semiconductor field effect transistor having a gate directly connected to a cathode of the zener diode and having a drain directly connected to a source of the junction field effect transistor.

2. The composite field effect transistor of claim 1, wherein the junction field effect transistor comprises a depletion mode junction field effect transistor.

3. The composite field effect transistor of claim 2, wherein the metal-oxide-semiconductor field effect transistor comprises an enhancement mode metal-oxide-semiconductor field effect transistor.

4. The composite field effect transistor of claim 3, wherein the enhancement mode metal-oxide-semiconductor field effect transistor comprises an n-channel enhancement mode metal-oxide-semiconductor field effect transistor.

5. The composite field effect transistor of claim 1, wherein the metal-oxide-semiconductor field effect transistor comprises an enhancement mode metal-oxide-semiconductor field effect transistor.

6. The composite field effect transistor of claim 1, wherein the gate of the metal-oxide-semiconductor field effect transistor and the cathode of the zener diode are coupled to an input impedance.

7. The composite field effect transistor of claim 6, wherein the input impedance comprises a capacitive element.

8. The composite field effect transistor of claim 6, wherein the input impedance comprises a resistive element.

9. The composite field effect transistor of claim 6, wherein the input impedance comprises:
   a capacitive element; and
   a resistive element coupled in parallel with the capacitive element.

10. The composite field effect transistor of claim 1, wherein the gate of the metal-oxide-semiconductor field effect transistor is further coupled to a drive signal.

11. A composite field effect transistor comprising:
    a zener diode;
    a depletion mode junction field effect transistor having a gate coupled to an anode of the zener diode;
    a metal-oxide-semiconductor field effect transistor having a drain coupled to a source of the depletion mode junction field effect transistor and having a gate coupled to a cathode of the zener diode and a drive signal.

12. The composite field effect transistor of claim 11, wherein the metal-oxide-semiconductor field effect transistor comprises an enhancement mode metal-oxide-semiconductor field effect transistor.

13. The composite field effect transistor of claim 12, wherein the enhancement mode metal-oxide-semiconductor field effect transistor comprises an n-channel enhancement mode metal-oxide-semiconductor field effect transistor.

14. The composite field effect transistor of claim 13, wherein the gate of the metal-oxide-semiconductor field effect transistor and the cathode of the zener diode is coupled to an input impedance.

15. The composite field effect transistor of claim 14, wherein the input impedance comprises:
    a capacitive element; and
    a resistive element coupled in parallel with the capacitive element.

16. The composite field effect transistor of claim 14, wherein a drain of the junction field effect transistor is coupled to a load impedance.

17. A composite field effect transistor comprising:
    a zener diode;
    a depletion mode junction field effect transistor, wherein a drain of the depletion mode junction field effect transistor is coupled to a drain of the composite field effect transistor and wherein a gate of the depletion mode junction field effect transistor is coupled to an anode of the zener diode; and
    an enhancement mode metal-oxide-semiconductor field effect transistor, wherein a drain of the enhancement mode metal-oxide-semiconductor field effect transistor is coupled to a source of the depletion mode junction field effect transistor, wherein a gate of the enhancement mode metal-oxide-semiconductor field effect transistor is coupled to a cathode of the zener diode and a gate of the composite field effect transistor, and wherein a source of the enhancement mode metal-oxide-semiconductor field effect transistor is coupled to a source of the composite field effect transistor.

18. The composite field effect transistor of claim 17, wherein the zener diode causes the enhancement mode metal-oxide-semiconductor field effect transistor to become fully enhanced before the gate of the depletion mode junction field effect transistor is clamped by a gate-to-source potential of the depletion mode junction field effect transistor, as the source of the depletion mode junction field effect transistor is pulled down.

19. The composite field effect transistor of claim 17, wherein the zener diode provides a bi-directional impedance path to charge and discharge a parasitic capacitance of the depletion mode junction field effect transistor.

20. The composite field effect transistor of claim 17, wherein the zener diode clamps a potential at the gate of the enhancement mode metal-oxide-semiconductor field effect transistor.

* * * * *